United States Patent
Matsui (10) Patent No.: US 7,852,033 B2
(45) Date of Patent: Dec. 14, 2010

(54) DRIVING CONTROL APPARATUS AND METHOD, AND EXPOSURE APPARATUS

(75) Inventor: Takayasu Matsui, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 274 days.

(21) Appl. No.: 11/092,658

(22) Filed: Mar. 30, 2005

(65) Prior Publication Data

US 2005/0219500 A1      Oct. 6, 2005

(30) Foreign Application Priority Data

Mar. 30, 2004   (JP) ............................. 2004-099730

(51) Int. Cl.
 *G05B 11/32* (2006.01)
(52) U.S. Cl. .................. 318/625; 318/632; 355/47; 355/55
(58) Field of Classification Search ............... 318/625, 318/632, 638, 652, 798, 799; 355/47, 55, 355/67; 250/492.2, 492.22
See application file for complete search history.

(56) References Cited

U.S. PATENT DOCUMENTS

| | | | |
|---|---|---|---|
| 6,236,447 B1 * | 5/2001 | Yamada et al. | 355/53 |
| 6,327,025 B1 * | 12/2001 | Imai | 355/53 |
| 6,509,956 B2 * | 1/2003 | Kobayashi | 355/55 |
| 6,584,367 B1 * | 6/2003 | Makino et al. | 700/60 |
| 6,668,202 B2 * | 12/2003 | Makino et al. | 700/56 |
| 6,819,433 B2 | 11/2004 | Takai et al. | 356/500 |
| 6,903,468 B2 * | 6/2005 | Korenaga | 310/12 |
| 6,984,838 B2 | 1/2006 | Kosugi | 250/559.3 |
| 7,019,836 B2 | 3/2006 | Mishima | 356/401 |
| 7,141,813 B2 | 11/2006 | Kosugi | 250/548 |
| 7,230,706 B2 | 6/2007 | Mishima | 356/401 |
| 2002/0109850 A1 | 8/2002 | Takai et al. | 356/500 |
| 2003/0048425 A1 * | 3/2003 | Iwanaga | 353/36 |
| 2003/0160195 A1 | 8/2003 | Kosugi | 250/559.29 |
| 2004/0036849 A1 * | 2/2004 | Kida et al. | 355/55 |
| 2006/0033055 A1 | 2/2006 | Kosugi | 250/548 |

FOREIGN PATENT DOCUMENTS

| | | |
|---|---|---|
| JP | 58-141341 | 8/1983 |
| JP | 58-141341 U | 9/1983 |

(Continued)

OTHER PUBLICATIONS

Japanese Office Action dated Jun. 15, 2009, issued in corresponding Japanese patent application No. 2004-099730, with an English translation.

*Primary Examiner*—Rina I Duda
(74) *Attorney, Agent, or Firm*—Fitzpatrick, Cella, Harper & Scinto (57) ABSTRACT

A driving control apparatus for driving a controlled object. The apparatus includes first and second interferometers, each of which (i) detects a position of the controlled object in a predetermined direction and (ii) produces a respective detection value. A control unit obtains a rotation amount of the controlled object based on the detection values produced by the first and second interferometers, at a predetermined measurement timing, to calculate a controlled variable based on the rotation amount and a target value, and to output the controlled variable. A generation unit generates the rotation amount based on a difference value between two average values, one being an average value of detection values that are obtained by the first interferometer between a first measurement timing and a second measurement timing, immediately after the first measurement timing, and the other being an average value of detection values that are obtained by the second interferometer between the first measurement timing and the second measurement timing. The generation unit outputs the generated rotation amount to the control unit at the second measurement timing.

8 Claims, 11 Drawing Sheets

FOREIGN PATENT DOCUMENTS

| | | |
|---|---|---|
| JP | 59-36806 | 2/1984 |
| JP | 62-260211 | 11/1987 |
| JP | 5-343282 | 12/1993 |
| JP | 2000-306829 | 11/2000 |
| JP | 2002-319541 | 10/2002 |
| JP | 2003-77806 | 3/2003 |
| JP | 2003-254710 | 9/2003 |
| JP | 2004079639 A * | 3/2004 |

* cited by examiner

DRIVING CONTROL APPARATUS AND METHOD, AND EXPOSURE APPARATUS

FIELD OF THE INVENTION

The present invention relates to a driving control apparatus, which measures the position of an object, or the like, and controls the position, rotation, and velocity of the object, or the like, on the basis of the measured value.

BACKGROUND OF THE INVENTION

To control an object to an arbitrary position or an arbitrary rotation, or to control to drive an object at an arbitrary velocity, the position of the object is measured by a sensor, and driving of the object is controlled on the basis of the measurement value.

For example, a semiconductor exposure apparatus comprises a stage which supports a wafer to be exposed to a pattern and can be driven at an arbitrary position, rotation, and velocity. A position measurement sensor for this stage is a laser interferometer (see, e.g., Japanese Patent Laid-Open No. 2002-319541). The current position, rotation, and velocity of the stage are calculated on the basis of the measurement value of the laser interferometer. To control the stage to an arbitrary position, rotation, and velocity, a control system calculates a necessary driving force from information on the current position, rotation, and velocity calculated on the basis of the measurement value of the laser interferometer and information on a target position, rotation, and velocity. The control system controls the stage to an arbitrary position, rotation, and velocity by driving an actuator attached to the stage in accordance with the calculated driving force.

In stage control, a measurement laser beam irradiates the surface of a bar mirror attached to the side surface of the stage, and reflected light is detected by the laser interferometer, measuring the stage position.

In this stage position measurement, the bar mirror is irradiated with a plurality of measurement laser beams having different optical axis positions along the same direction, and the stage position is measured at a plurality of positions. The difference between these measurement values is used to detect the rotation amount and inclination amount of the stage. For example, a plurality of measurement laser beams are arranged side by side in directions parallel and perpendicular to the driving plane of the stage. Calculation is done on the basis of the difference between these measurement values and the distance between the optical axes of the beams. The stage rotation amount is calculated from the difference between two measurement values in the horizontal direction, and the stage inclination amount is calculated from the difference between two measurement values in the vertical direction.

In a position sensor available at present, an error may be superposed on a measurement value owing to a kind of medium (for example, a kind of a gas) and fluctuations of magnetic field and electrical field, or the like, in a space between an object to be measured and the sensor main body. An error which makes the output nonlinear may occur also when the actual displacement of an object is a linear change. If the level of the nonlinear error changes depending on the individual difference in the sensor, the displacement in the rotational direction is calculated even upon translating the stage in, e.g., only the X direction when the rotation amount and inclination amount are calculated from the above-described difference among a plurality of axes.

SUMMARY OF THE INVENTION

The present invention has been made to overcome the above drawbacks, and has as its object to reduce the influence of a sensor measurement error and to implement accurate driving control of an object in controlling to drive the object.

According to one aspect of the present invention, there is provided a driving control apparatus comprising a control unit configured to repeat a control cycle of receiving a status value and a target control value of a controlled object and outputting a controlled variable of the controlled object, a detector which detects any one of a position, a velocity, and an acceleration of the controlled object, and a generation unit configured to generate the status value to be input to the control unit by using a plurality of detection values by acquiring the plurality of detection values from the detector during one control cycle.

Also, according to another aspect of the present invention, there is provided a driving control method for a driving control apparatus having a control unit configured to repeat a control cycle of receiving a status value and a target control value of a controlled object and outputting a controlled variable of the controlled object, and a detector which detects any one of a position, a velocity, and an acceleration of the controlled object, the method comprising a generation step of generating the status value by using a plurality of detection values by acquiring the plurality of detection values from the detector during one control cycle, and an input step of inputting the status value generated in the generation step to the control unit.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

In the following embodiment, an object driving control technique according to the present invention is applied to driving of the stage of a semiconductor exposure apparatus.

First Embodiment

Figure 11:
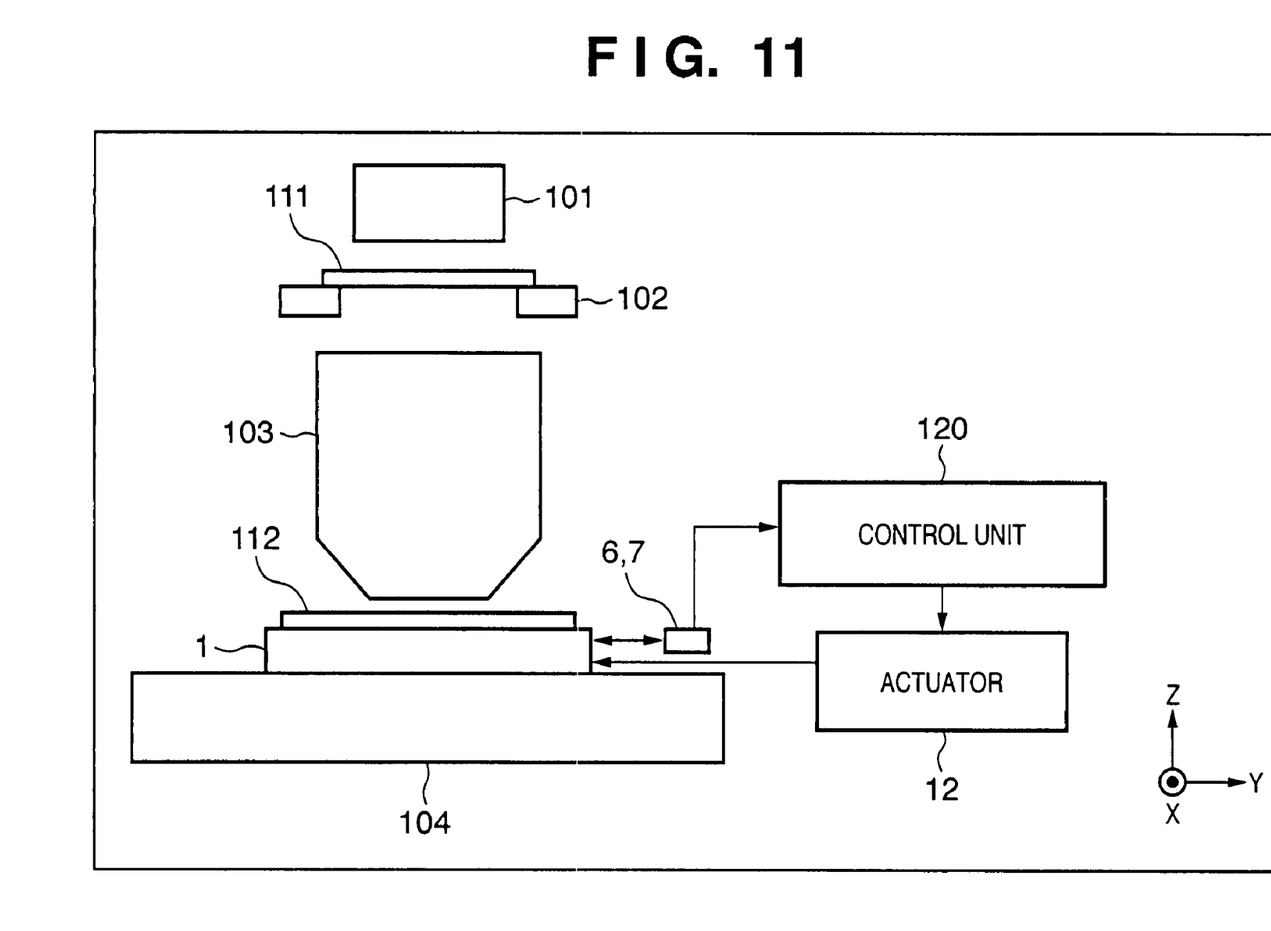
FIG. 11 is a schematic view showing the schematic arrangement of an exposure apparatus according to the first embodiment.

FIG. 11 is a schematic view showing the schematic arrangement of an exposure apparatus according to the first embodiment. In FIG. 11, a reticle 111 held on a reticle stage 102 is irradiated with exposure light emitted by an illumination unit 101. Exposure light having passed through the reticle 111 enters a projection optical system 103. The projection optical system 103 reduces, at a predetermined magnification, a pattern image formed by exposure light having passed through the reticle 111, and the reduced pattern image is projected onto a wafer 112 held by a wafer stage 1. The wafer stage 1 two-dimensionally moves on a surface plate 104.

The position of the wafer stage 1 is measured by laser interferometers 6 and 7, and the like, and measurement values are input to a control unit 120. The control unit 120 outputs a drive signal to an actuator 12 so as to drive the stage to a target position on the basis of the input measurement values. The actuator 12 controls to drive the wafer stage 1 in accordance with the drive signal from the control unit 120. FIG. 11 illustrates a laser interferometer which measures a position along the Y-axis, but a laser interferometer which measures a position along the X-axis may be arranged and utilized to control the drive of the wafer stage 1.

The following embodiment is related to control of rotation (rotation around the Z-axis) of the stage by measuring a position along the Y-axis. Other driving control operations (stage inclination (rotation around the X- and Y-axes), a position along the X-axis, a position along the Y-axis, and the like) can also be implemented by the same arrangement and method as those for rotation control to be described below.

Figure 1:
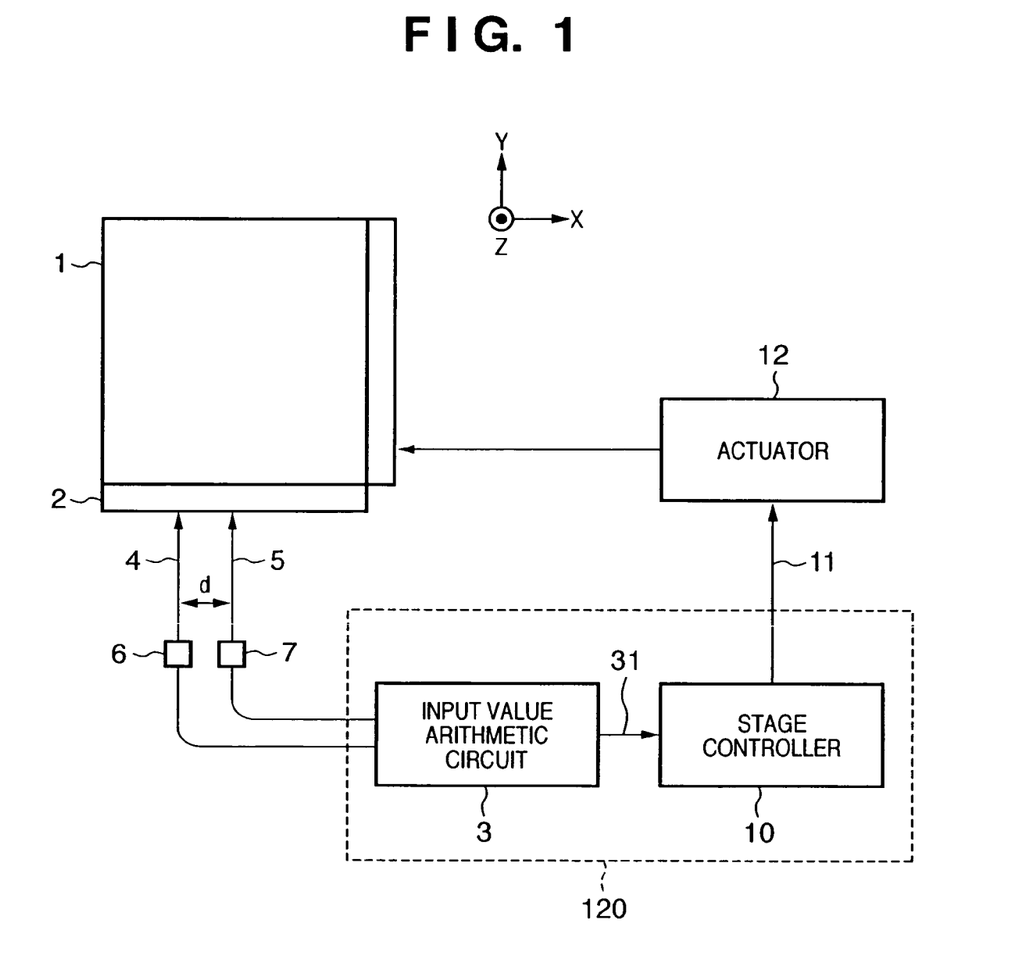
FIG. 1 is a block diagram schematically showing an example of the arrangement of a stage control apparatus according to the first embodiment.

FIG. 1 is a block diagram schematically showing an example of the arrangement of a stage control apparatus according to the first embodiment. FIG. 1 is a schematic view showing an arrangement associated with stage control that is extracted from the arrangement of the exposure apparatus in FIG. 11 and viewed from the Z-axis. In the following embodiment, the wafer stage 1 will be simply referred to as the stage 1.

In FIG. 1, the stage 1 can be driven in the X and Y directions within the X-Y plane, a rotational direction centered on the Z-axis perpendicular to the X-Y plane, and an inclination direction around the Y-axis. As described above, control of the rotational direction of the stage 1 will be explained.

As shown in FIG. 1, a bar mirror 2 is attached to the stage 1, and irradiated with measurement laser beams 4 and 5. The measurement laser beams 4 and 5 are emitted so as to be arranged at a predetermined interval d within the same X-Y plane. The Y displacement of the stage 1 is measured by the measurement laser beams 4 and 5, and the interferometers 6 and 7 serving as position detection sensors. An input value arithmetic circuit 3 calculates the current position (rotation amount) of the stage 1 in the rotational direction on the basis of the difference between measurement values obtained by the interferometers 6 and 7, and the interval d between the measurement laser beams 4 and 5. The input value arithmetic circuit 3 calculates a rotation amount 31 by using a predetermined number of measurement values from the interferometers 6 and 7, details of which will be described below. A stage controller 10 receives the rotation amount 31 calculated by the input value arithmetic circuit 3 as an input value, calculates the controlled variable of the stage on the basis of the input value and a separately set target value, and outputs the controlled variable as a stage manipulated variable 11. An actuator 12 drives the stage 1 in accordance with the input stage manipulated variable 11.

Figure 2:
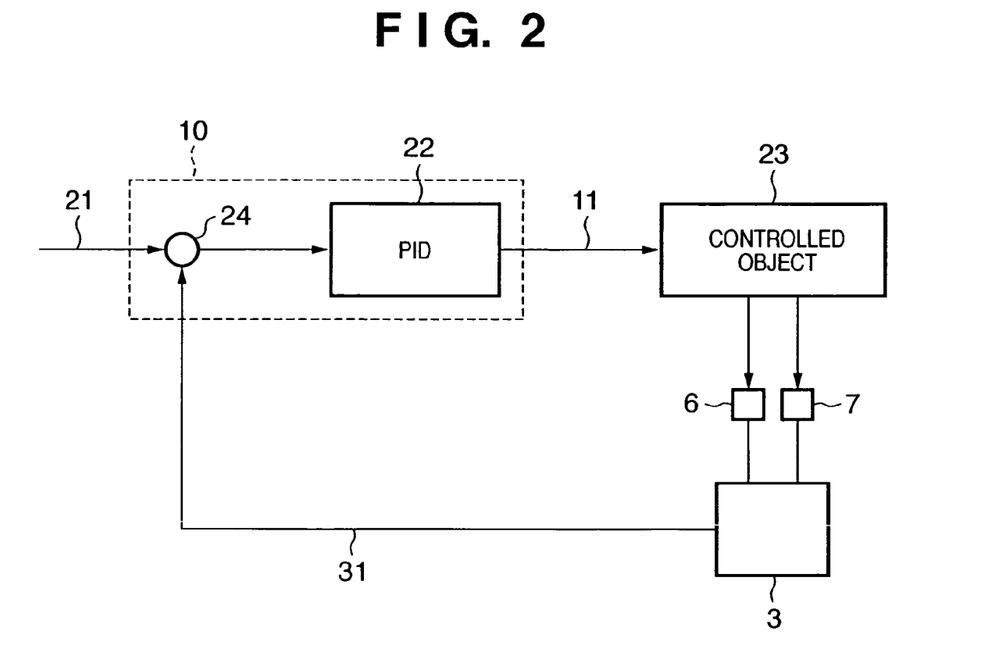
FIG. 2 is a block diagram for explaining the control loop of a control system associated with the rotation amount of a stage 1 in FIG. 1.

FIG. 2 is a block diagram for explaining the control loop of a control system associated with the rotation amount of the stage 1 in FIG. 1. In the stage controller 10, the difference value between a target value 21 and the rotation amount 31 calculated by the input value arithmetic circuit 3 is input to a PID compensator 22, and the PID compensator 22 outputs a controlled variable (stage manipulated variable 11) for driving the stage 1. The stage manipulated variable 11 is supplied to a controlled object 23 (stage 1 and actuator 12 in FIG. 1), and the stage 1 is driven in accordance with the stage manipulated variable 11. Measurement values from the interferometers 6 and 7, serving as position detection sensors for the stage 1, are input to the input value arithmetic circuit 3 to calculate the rotation amount 31.

The flow of signals in one control cycle of the control system shown in FIG. 2 when the target value 21 is input to drive the stage to a target rotation position will be considered. The deviation of the input target value 21 from the current value (rotation amount 31) is calculated by a subtractor 24, and input to the PID compensator 22. The stage controller 10 controls driving of the stage 1 by supplying the stage manipulated variable 11 obtained by the PID compensator 22 to the actuator 12 of the controlled object 23.

The position of the stage 1 is measured by the interferometers 6 and 7 serving as position detection sensors. The input value arithmetic circuit 3 calculates the displacement (rotation amount 31) in the rotational direction that is obtained from the difference between measurement values from the interferometers 6 and 7. The calculated rotation amount 31 is sent back to the differentiator 24, and used to calculate the deviation from the target value. In this manner, one control cycle of the control system is formed. As the control cycle proceeds, the deviation between the target position and the current value decreases and converges to a target value.

In general, the position of the stage 1 is measured once in one control cycle, and control is executed on the basis of the measurement value. To the contrary, in the first embodiment, the position is measured by the interferometers 6 and 7 a plurality of number of times in one control cycle, and the rotation amount 31 is calculated on the basis of a plurality of measurement values.

Figure 3:
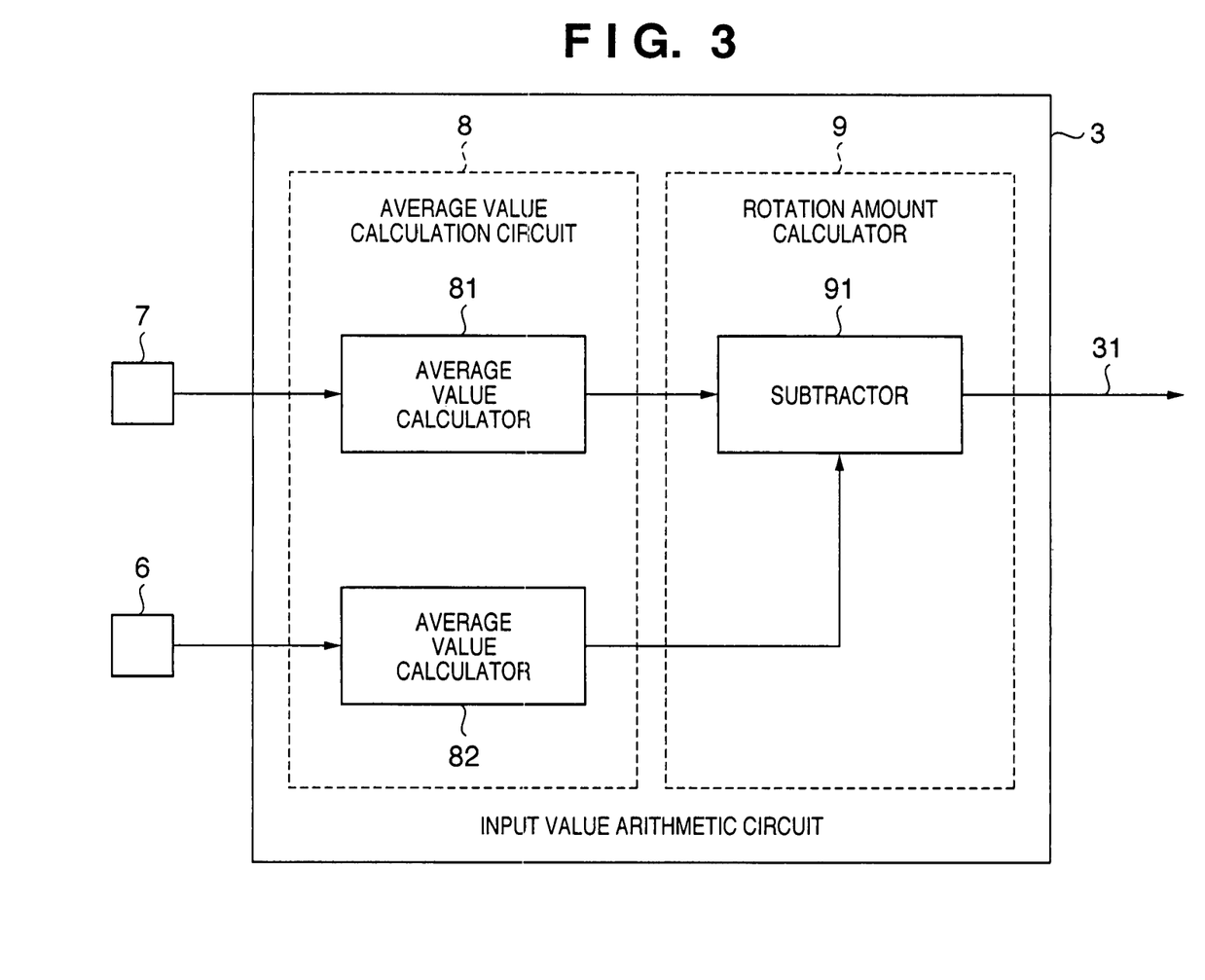
FIG. 3 is a block diagram showing the arrangement of an input value arithmetic circuit 3 according to the first embodiment.

FIG. 3 is a block diagram showing the arrangement of the input value arithmetic circuit 3 according to the first embodiment. The measurement values of the interferometers 6 and 7 are respectively input to average value calculators 82 and 81 in an average value (to be referred to as a measurement average value hereinafter) of a predetermined number of measurement values. As described above, "a predetermined number of measurement values" refers to measurement values acquired in one control cycle by the stage controller 10.

The predetermined number is set on the basis of the time of one control cycle and a time required for measurement by the laser interferometer. Note that the number of measurement values to be acquired may be set by the user via an operation panel, or the like. Measurement average values output from the average value calculators 81 and 82 are input to an arithmetic unit 91 in a rotation amount calculator 9 to calculate the rotation amount 31 by using the difference between the measurement average values and the interval d.

In FIG. 3, the averages of measurement values from the interferometers 7 and 6 are respectively calculated by the two average value calculators 81 and 82. For example, when a measurement value from one interferometer is known in advance to be very stable, the average value of stable measurement values need not be calculated. In the following example, measurement values from the interferometer 7 are stable, and only measurement values form the interferometer 6 are averaged. The average value calculator may be omitted for an interferometer whose measurement value is stable. Also, the user may set whether to validate or invalidate the average value calculation process in each of the average value calculators 81 and 82. In this case, an "invalid" average value calculator provides a raw measurement value to the rotation amount calculator 9.

Figure 4A:
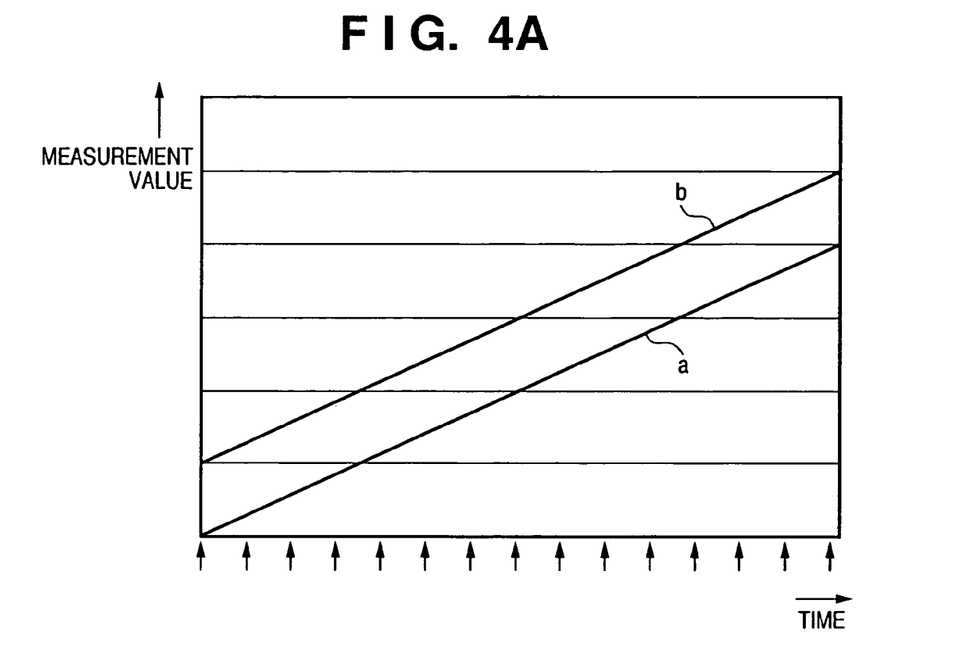
FIGS. 4A and 4B are graphs for explaining ideal measurement values and their arithmetic values.
Figure 4B:
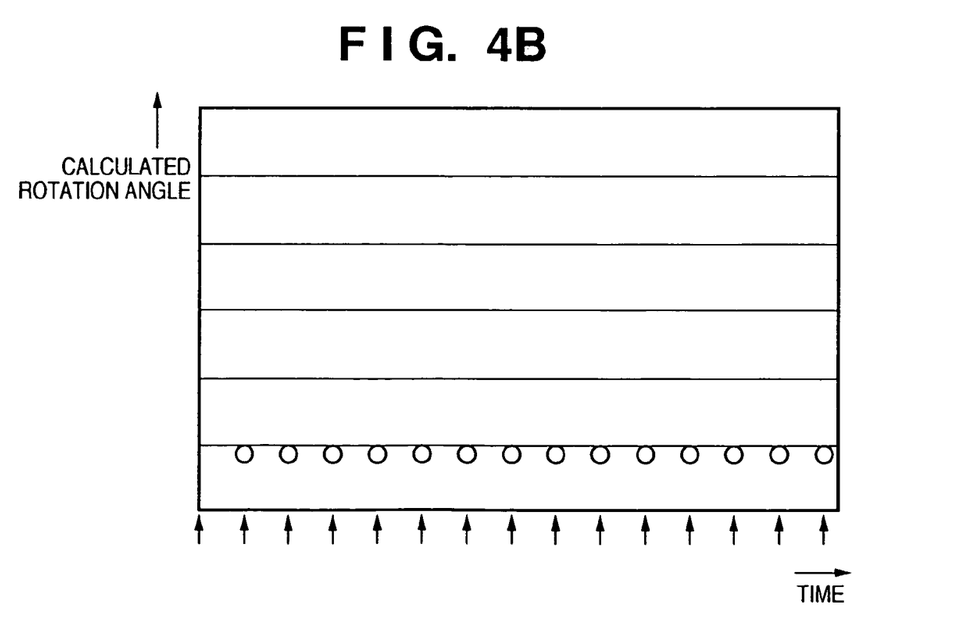

FIG. 4A is a graph showing the relationship between the time and an output value from the position sensor when the stage 1 is driven in the Y direction at a predetermined velocity while holding a predetermined rotation angle in FIG. 1. The abscissa represents the time, and the ordinate represents the output value (measurement value) of the interferometer. Each arrow along the abscissa indicates a measurement timing in each control cycle. In FIG. 4A, a represents the measurement value of the interferometer 7, and b represents that of the interferometer 6. When the output signal of the sensor is accurately output in response to a change in position, sensor outputs, as represented by the measurement values a and b in FIG. 4A, are ideally obtained upon driving the stage in the Y direction at a constant velocity. The rotational angle in FIG. 4B is a value obtained from the difference between the measurement values a and b, and the interval d between the measurement laser beams 4 and 5. When measurement results as shown in FIG. 4A are attained, rotational angles shown in FIG. 4B are obtained at the measurement timings of respective control cycles. Note that the time axes in FIGS. 4A and 4B coincide with each other. As shown in FIG. 4B, when the stage is driven in the Y direction, while keeping a predetermined angle, the rotation angle obtained from the difference between the measurement values a and b, and the interval d between the measurement laser beams 4 and 5, is kept constant regardless of the time.

Figure 5A:
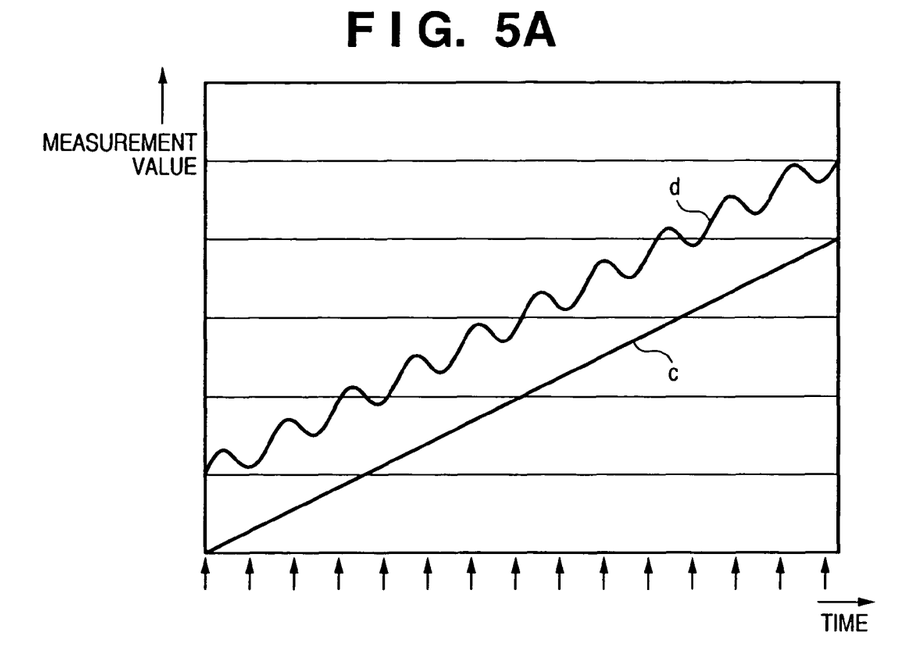
FIGS. 5A and 5B are graphs for explaining measurement values and their arithmetic values when the measurement values vary owing to an error.
Figure 5B:
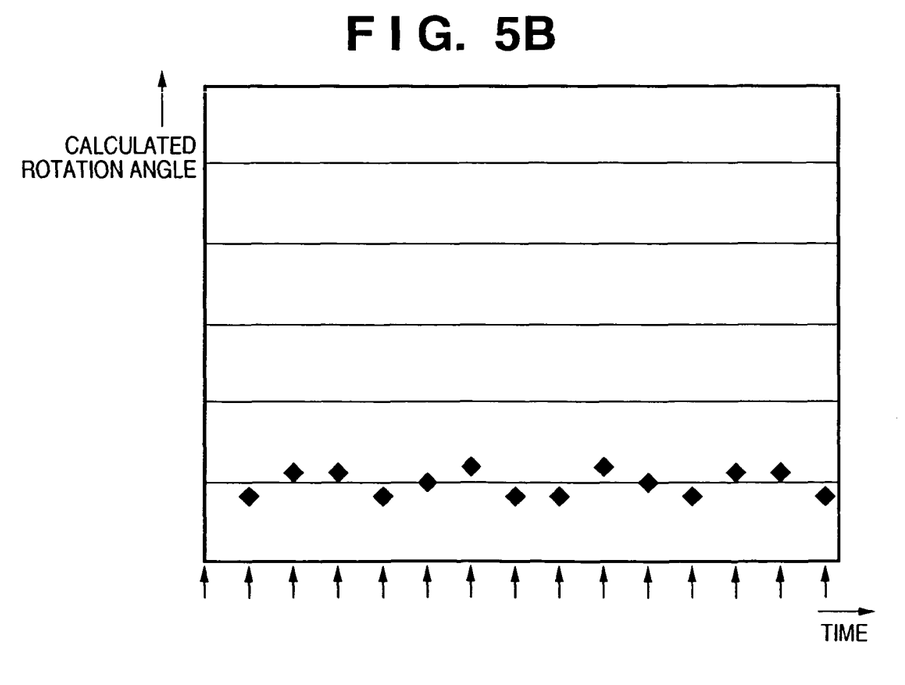

When, for example, the measurement value of the interferometer 6 has a nonlinear error depending on the Y position, the calculation value of the rotation angle is influenced. This case will be explained with reference to FIGS. 5A and 5B. FIGS. 5A and 5B are graphs showing the relationship between the measurement value by the sensor and the time upon the same driving as that in FIGS. 4A and 4B. In FIG. 5A, c represents the measurement value of the interferometer 7, and d represents that of the interferometer 6. FIG. 5B shows a rotation angle obtained from the difference between the measurement values c and d at the measurement timing of each control cycle, and the interval d between the measurement laser beams 4 and 5. As shown in FIG. 5B, when the output value of the sensor has a nonlinear error, the rotation angle obtained on the basis of the difference between the measurement values c and d at the measurement timing of each control cycle is measured so as to change in accordance with the Y position, though the stage actually keeps a predetermined angle.

Figure 6A:
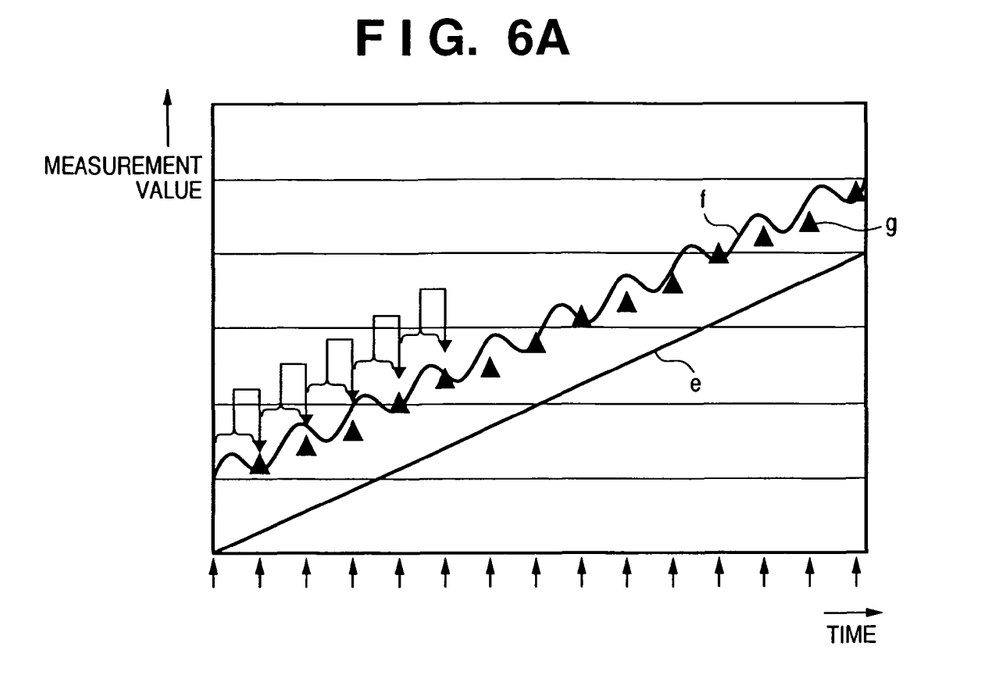
FIGS. 6A and 6B are graphs for explaining measurement values and their arithmetic values according to the first embodiment.
Figure 6B:
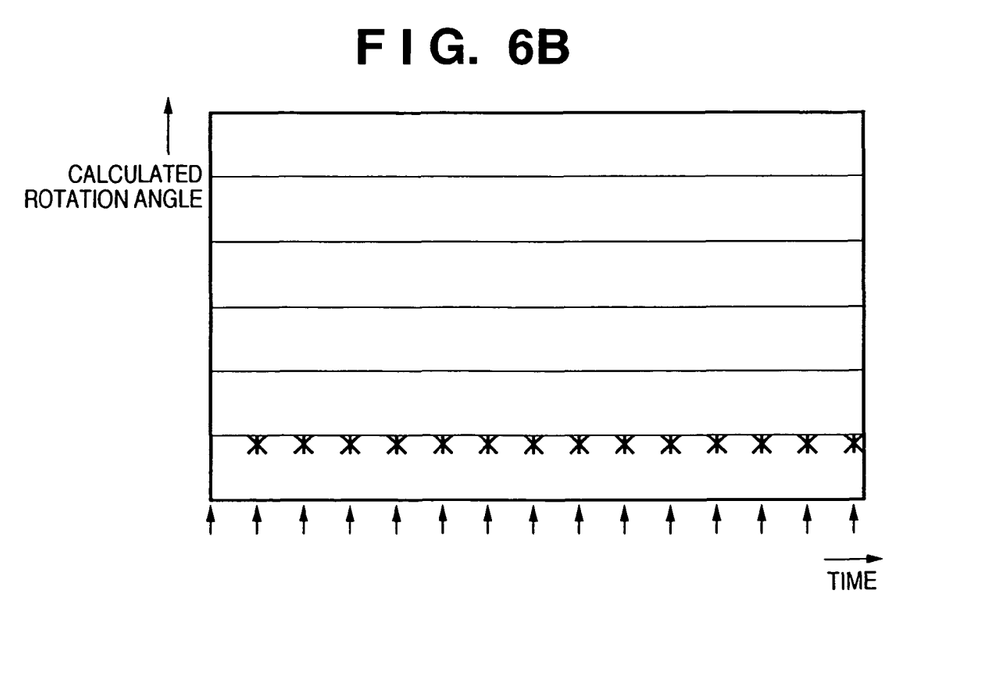

FIGS. 6A and 6B show an example of the rotation angle obtained using the driving control apparatus according to the first embodiment. In FIG. 6A, e represents the measurement value of the interferometer 7, and f represents that of the interferometer 6. Measurement using the interferometer 6 is performed a plurality of number of times during each control cycle (during the measurement timing of each control cycle). The average value of measurement values is calculated by the average value calculator 82, and uses, as a measurement value, one input at the measurement timing of each control cycle. In FIG. 6A, g represents the plot of each calculated average value. FIG. 6B shows a rotation angle obtained from the difference between the value g and the value e at the measurement timing, and the interval d between the measurement laser beams 4 and 5. In this way, even when an error is superposed on the output of the measurement value, the influence of the error on a calculated rotation angle can be reduced. In controlling to drive the stage, the influence of a sensor measurement error can be reduced to implement accurate driving control of the stage.

Second Embodiment

The average value of measurement values from an interferometer is calculated in the first embodiment, but the average value of rotation amounts may be calculated.

Figure 7:
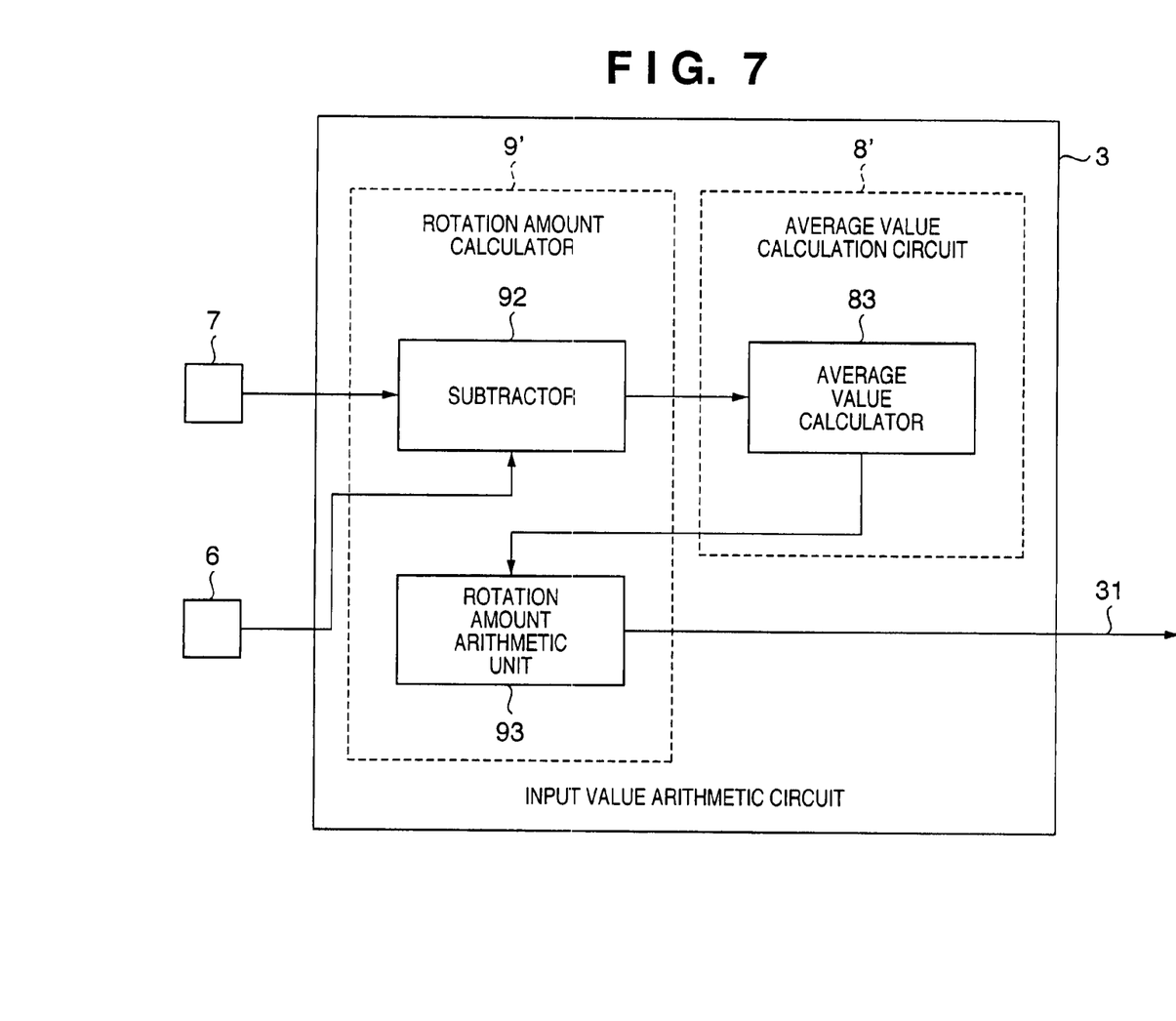
FIG. 7 is a block diagram showing the arrangement of an input value arithmetic circuit 3 according to the second embodiment.

FIG. 7 is a block diagram showing the arrangement of an input value arithmetic circuit 3 according to the second embodiment. The measurement values of interferometers 7 and 6 are input to a subtractor 92. The subtractor 92 calculates the difference between the input measurement values, and outputs the difference value. Similar to the first embodiment, a plurality of measurement values is acquired by the interferometers 6 and 7 during one control cycle (during the measurement timing of each control cycle), and a plurality of difference values are output from the subtractor 92. An average value calculator 83 averages these difference values, and inputs the average value to a rotation amount arithmetic unit 93. The rotation amount arithmetic unit 93 converts the input difference value into a rotation amount 31 by using the interval d between measurement laser beams, and outputs the rotation amount 31. The number of difference values corresponds to that of measurement values acquired by the interferometers 6 and 7, and can be arbitrarily set by the user, similar to the first embodiment.

Figure 8A:
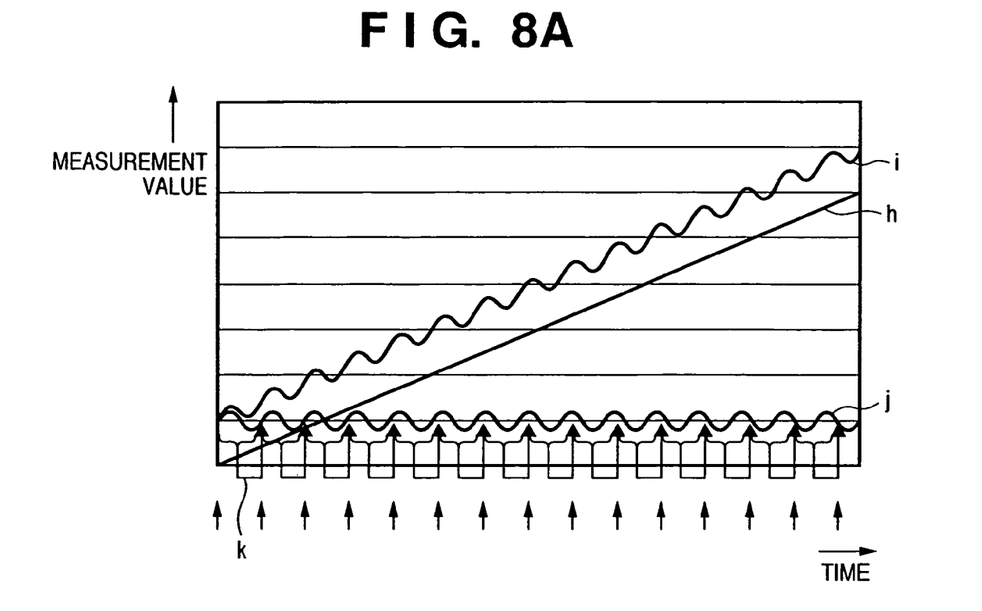
FIGS. 8A and 8B are graphs for explaining measurement values and their arithmetic values according to the second embodiment.

The state of each signal (measurement value) in the input value arithmetic circuit 3 will be explained with reference to FIGS. 8A and 8B. In FIG. 8A, h represents the measurement value of the interferometers 7, and i represents that of the interferometer 6. Reference character j represents the result of calculating the difference between the measurement values h and i a plurality of number of times during each control cycle, i.e., represents an output from the subtractor 92. Reference character k represents calculation of the average value during each control cycle for the value calculated by the subtractor 92, i.e., represents the operation of the average value calculator 83.

Figure 8B:
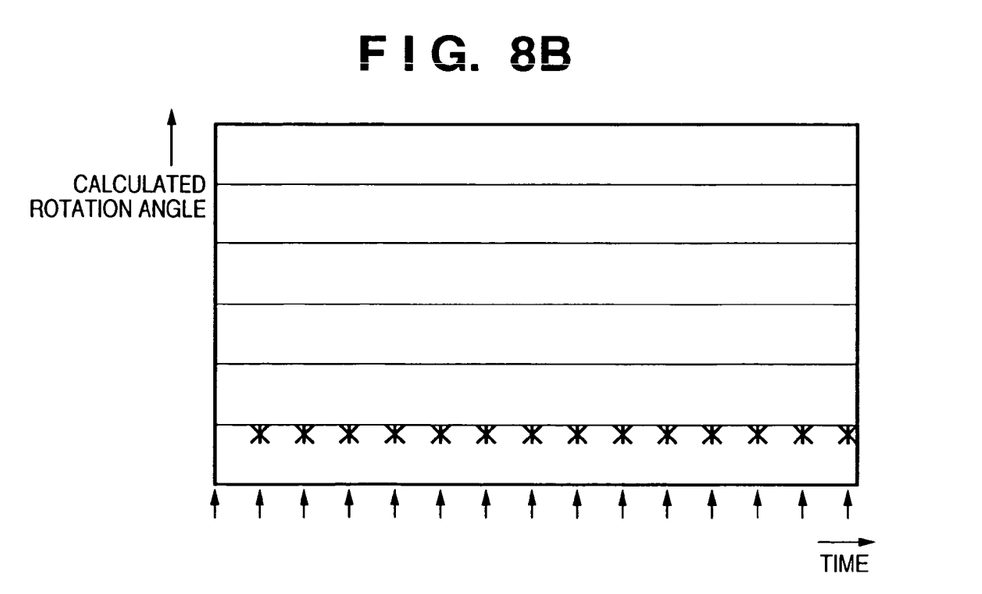

FIG. 8B shows a rotation amount obtained by the rotation amount arithmetic unit 93 from an average value calculated by the average value calculator 83. Similar to the first embodiment (FIG. 6B), even when an error is superposed on the output of a measurement value, the influence of the error on a rotation angle can be reduced, implementing high-precision driving control.

In the second embodiment, the rotation amount is calculated using the interval d, and the average value of difference values. In other words, a plurality of values (difference values) corresponding to rotation amounts are calculated from the average value. Alternatively, a plurality of rotation amounts may be calculated from difference values and the interval d to obtain their average value.

Third Embodiment

Figure 9:
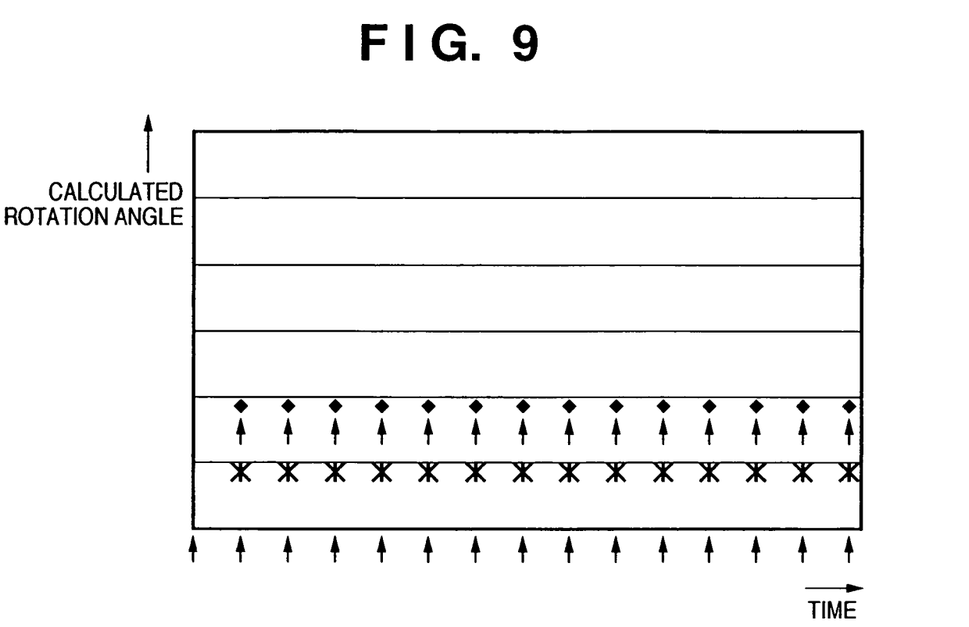
FIG. 9 is a graph for explaining application of a bias to an arithmetic value according to the third embodiment.

The rotation amount calculated in the first and second embodiments may be given an arbitrary offset. FIG. 9 shows this state. The offset is used to correct the rotation amount when the rotation amount has a predetermined offset from a true value upon averaging owing to the output characteristic of a sensor.

Fourth Embodiment

The average value calculator in the first and second embodiments simply calculates the average value of input measurement values or difference values. An average value calculator in the fourth embodiment excludes a singular value from values used to calculate an average value, thereby reducing the influence of noise, or the like, on driving control. The fourth embodiment will be described with reference to FIG. 10. The following embodiment will explain a case in which an average value calculator 83 detects a singular value from difference values obtained by a subtractor 92 in the arrangement according to the second embodiment. It is apparent that average value calculators 81 and 82 may detect and exclude a singular value in the arrangement according to the first embodiment.

Figure 10:
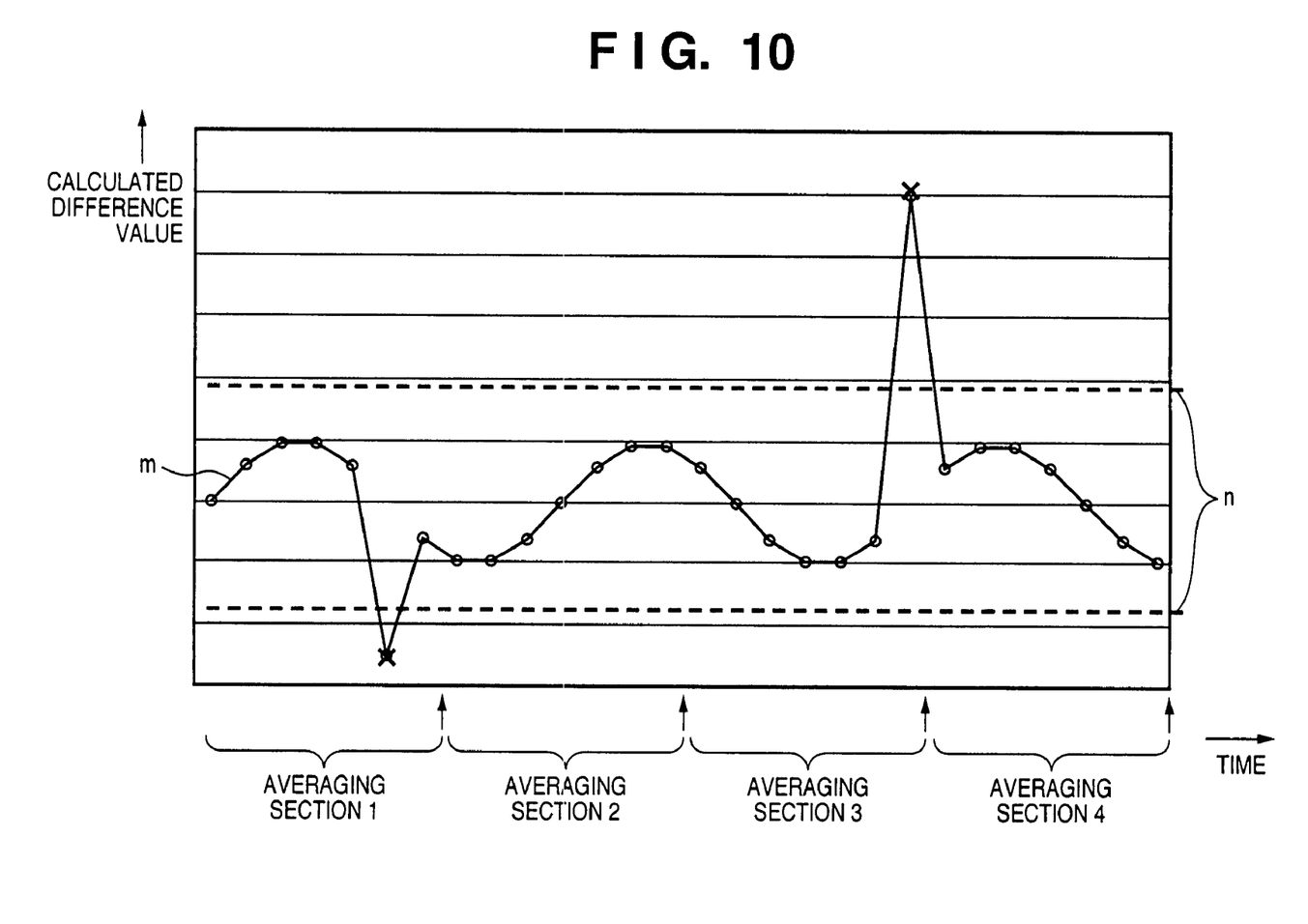
FIG. 10 is a graph for explaining a process of excluding a singular value from calculation of an average value according to the fourth embodiment.

In FIG. 10, m represents an output (difference value) from the subtractor 92 in FIG. 7. Each averaging section starts immediately after a measurement timing in the control cycle and continues until just before the next measurement timing. An average value is calculated from measurement values in the averaging section, and serves as an input value to a stage controller 10 at the measurement timing. In FIG. 10, the abscissa represents the time, and the ordinate represents the difference value. Each arrow along the abscissa indicates the measurement timing of the stage controller 10 in each control cycle. When an input value is supplied at the measurement timing, the stage controller 10 starts the control cycle, and outputs a controlled variable corresponding to the input value.

As shown in FIG. 10, the fourth embodiment can set n, representing a tolerance. In calculating an average value during each control cycle, a point exceeding the tolerance n is not used to calculate an average value. In FIG. 10, values (1001 and 1002) exceeding the tolerance n are generated in averaging sections 1 and 3. Hence, difference values at these points are not used to calculate average values in averaging sections 1 and 3. That is, the value 1001 in averaging section 1 and the value 1002 in averaging section 3 are excluded from values used to calculate an average value. This can reduce the influence of a singular point generated by noise, or the like. The tolerance n can be determined on the basis of a control deviation, which can be estimated in advance from the characteristic of a controlled object. As a tolerance setting method, a predetermined fixed range (n/2) from a target control value may be set. Alternatively, the tolerance n may be dynamically changed such that a width of ±n/2 with respect to an average value in the preceding average section is set.

In the above-described embodiments, two measurement beams used to calculate a difference are arranged on the same horizontal plane, and a change of the stage 1 in the rotational direction is calculated. The same signal process as the above one can also be applied when two measurement beams are arranged in a direction (Z direction) perpendicular to the X-Y plane, and a change of the stage in the inclination direction is calculated. For a control system which receives a stage position as an input value, the above-described averaging process can be done for position information acquired from one interferometer to exploit an obtained average value as an input value.

The same arithmetic method can also be employed to calculate distortion from the difference between two measurement beams.

In the above embodiments, the position of the stage serving as a controlled object is detected to generate an input value to the control system. It is apparent that the present invention can also be applied to an arrangement in which the velocity or acceleration of the stage is detected and used to generate an input value to the control system. For example, the average value of positions or velocities of a controlled object in the translation direction in one control cycle can be calculated and used as an input value to the control system. Further, the present invention can also be applied to a control system which receives as an input value the rotation, inclination, distortion, rotation velocity, or inclination velocity of a controlled object, or the like. In this case, the average value of measurement values from, e.g., two velocity sensors in one control cycle is acquired, and the rotational velocity is calculated using the acquired average value and can be used as an input value to the control system. Alternatively, the rotation velocity (or corresponding value) is calculated on the basis of measurement values from two velocity sensors, and the average value of rotation velocities obtained in one control cycle can be used. In this fashion, the present invention can be applied to any control system which receives as an input value the position, velocity, acceleration, rotation, inclination, distortion, rotation velocity, or inclination velocity of a controlled object, or the like.

As has been described above, according to the arrangement of the present invention, a measurement error of an object can be reduced to control to drive the object to a more accurate target value. That is, in controlling to drive an object, the influence of a sensor measurement error can be reduced to control the object to an accurate position, velocity, acceleration, rotation, inclination, distortion, rotation velocity, or inclination velocity of a controlled object, or the like.

As many apparently widely different embodiments of the present invention can be made without departing from the spirit and scope thereof, it is to be understood that the invention is not limited to the specific embodiments thereof except as defined in the appended claims.

CLAIM OF PRIORITY

This application claims priority from Japanese Patent Application No. 2004-099730 filed on Mar. 30, 2004, which is hereby incorporated by reference herein.

What is claimed is:

1. A driving control apparatus for driving a controlled object, said apparatus comprising:
   first and second interferometers, each of which (i) detects a position of the controlled object in a predetermined direction and (ii) produces a respective, detection value;
   a control unit configured (i) to obtain a rotation amount of the controlled object based on the detection values produced by the first and second interferometers, at a predetermined measurement timing, (ii) to calculate a controlled variable based on the rotation amount and a target value, and (iii) to output the controlled variable; and a generation unit configured to generate the rotation amount based on a difference value between two average values, one being an average value of detection values that are obtained by the first interferometer between a first measurement timing and a second measurement timing, immediately after the first measurement timing, and the other being an average value of detection values that are obtained by the second interferometer between the first measurement timing the second measurement timing, and to output the generated rotation amount to the control unit at the second measurement timing.

2. The apparatus according to claim 1, further comprising an offset unit configured to add an arbitrary offset value to, and to subtract the arbitrary offset value from, the status value generated by said generation unit, and to input the status value to said control unit.

3. The apparatus according to claim 1, wherein said generation unit comprises a setting unit configured to set the number of detection values from the first interferometer to be used for calculating an average value of detection values of the first interferometer, based on (i) a time between the first measurement timing and the second measurement timing and (ii) a time required for measurement of the first interferometer, and to set the number of detection values from the second interferometer to be used for calculating an average value of values of the second interferometer, based on (i) the time between the first measurement timing and the second measurement timing and (ii) a time required for measurement by the second interferometer.

4. The apparatus according to claim 1, wherein said generation unit calculates (i) an average value using only detection values that fall within an allowable range from among detection values detected by the first interferometer, in a period between the first measurement timing and the second measurement timing, and (ii) an average value using only detection values that fall within an allowable range from among detection values detected by the second interferometer, in the period between the first measurement timing and the second measurement timing.

5. An exposure apparatus comprising:

a stage which supports a substrate and moves;

an exposure unit configured to project a predetermined pattern onto the substrate held by said stage; and a control unit configured to control said stage, as a controlled object, by driving a control apparatus defined in claim 1.

6. A driving control apparatus for driving a controlled object, said apparatus comprising:

first and second interferometers, each of which (i) detects a position of the controlled object in a predetermined direction and (ii) produces a respective detection value;

a control unit configured (i) to obtain a rotation amount of the controlled object based on the detection values produced by the first and second interferometers, at a predetermined measurement timing, (ii) to calculate a controlled variable based on the rotation amount and a target value, and (iii) to output the controlled variable; and a generation unit configured to generate the rotation amount based on a difference value between an average value and a single detection value, wherein the average value is obtained from a plurality of detection values detected by the first interferometer between a first measurement timing and a second measurement timing, immediately after the first measurement timing, and the single detection value is detected by the second interferometer at the second measurement timing, and to output the generated rotation amount to the control unit at the second measurement timing.

7. A driving control apparatus for driving a controlled object, said apparatus comprising:

first and second interferometers, each of which (i) detects a position of the controlled object in a predetermined direction and (ii) produces a respective detection value;

a control unit configured (i) to obtain a rotation amount based on the detection values produced by the first and second interferometers, at a predetermined measurement timing, (ii) to calculate a controlled variable at a predetermined measurement timing, (iii) to calculate a controlled variable of the controlled target based on the rotation amount and a target value, and (iv) to output the controlled variable; and a generation unit configured to generate the rotation amount from a difference value between a detection value of the first interferometer and the detection value of the second interferometer, and to output an average value of a plurality of rotation values calculated between the first measurement timing and a second measurement timing, immediately after the first measurement timing, at the second measurement timing.

8. The apparatus according to claim 7, wherein said generation unit calculates an average value using only rotation amounts that fall within an allowable range from rotation amounts that are calculated, in a timing between the first measurement timing and the second measurement timing.

* * * * *